United States Patent [19]
Mori et al.

[11] Patent Number: 6,005,248
[45] Date of Patent: Dec. 21, 1999

[54] METHOD FOR OBSERVING A REACTION PROCESS BY TRANSMISSION ELECTRON MICROSCOPY

[75] Inventors: Kayoko Mori, Nara; Fumitoshi Yasuo, Ayama-gun; Akihiko Nakano, Nara, all of Japan

[73] Assignee: Sharp Kabushiki Kaisha, Osaka, Japan

[21] Appl. No.: 09/127,867

[22] Filed: Aug. 3, 1998

[30] Foreign Application Priority Data

Aug. 7, 1997 [JP] Japan ................................. 9-213044

[51] Int. Cl.⁶ .......................................................... H01J 37/26
[52] U.S. Cl. ............................................................ 250/311
[58] Field of Search ................................. 250/311, 492.2

[56] References Cited

U.S. PATENT DOCUMENTS 5,278,408   1/1994   Kakibayashi et al. ................... 250/311

FOREIGN PATENT DOCUMENTS 0 616 046 A1   9/1994   European Pat. Off. .
0 687 897 A1   12/1995  European Pat. Off. .
0 735 586 A2   10/1996  European Pat. Off. .
0 784 211 A2   7/1997   European Pat. Off. .
5-180739       7/1993   Japan .

OTHER PUBLICATIONS

"Denshi Kenbikyo Giho (Electron Microscopy), edited by Electron Microscopy Society of Japan, Kanto Branch, published by Asakura Shoten, 1991, pp. 119–130".

Patent Abstracts of Japan vol. 016, No. 264 (P–1370), Jun. 15, 1992 & JP 04 066840 A (Nippon Telegr & Teleph Corp), Mar. 3, 1992.

Patent Abstracts of Japan vol. 098, No. 010, Aug. 31, 1998 & JP 10 123030 A (Sharp Corp), May 15, 1998.

Patent Abstracts of Japan vol. 012, No. 161 (P–702), May 17, 1998 & JP 62 274237 A (Fujitsu Ltd), Nov. 28, 1987.

*Primary Examiner*—Kiet T. Nguyen
*Attorney, Agent, or Firm*—Nixon & Vanderhye, PC

[57] ABSTRACT

A region on a surface side of a sample is irradiated with a Ga ion beam to form a first laminar portion having a thickness of 50–200 nm small enough to allow the transmission electron microscopic observation. While the sample is being heated within a transmission electron microscope, a process in which silicide is being formed is observed at the first laminar portion. Thereafter, a second laminar portion is formed in a thick region of the sample, similarly to the first laminar portion. Then, the first and second laminar portions are comparatively observed in a non-heated state with the transmission electron microscope. If observation results of the two laminar portions in the non-heated state are the same, a result of observing the first laminar portion during the heating is taken to represent a phenomenon in a bulk state. If observation results of the two laminar portions are different from each other, the result of observing the first laminar portion during the heating is taken to represent a unique phenomenon resulting from the heating of the sample in a thin film state. Thus, a transmission electron microscopic observation involving the simultaneous heat treatment is correctly carried out with a few samples.

4 Claims, 5 Drawing Sheets

Observation by Transmission Electron Microscopy

Fig.1A
Fig.1B
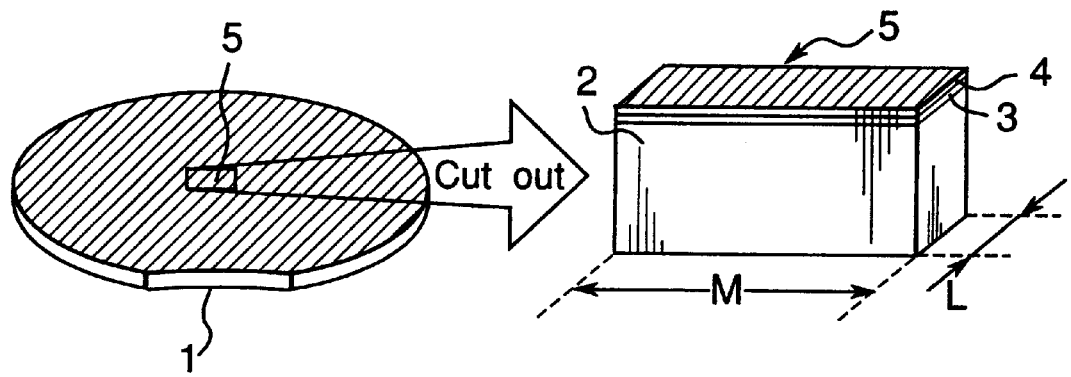
Fig.2
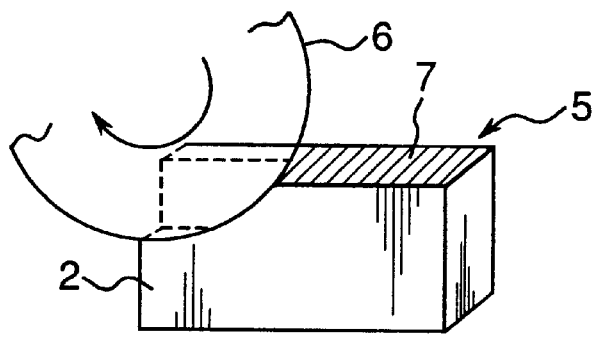
Fig.3
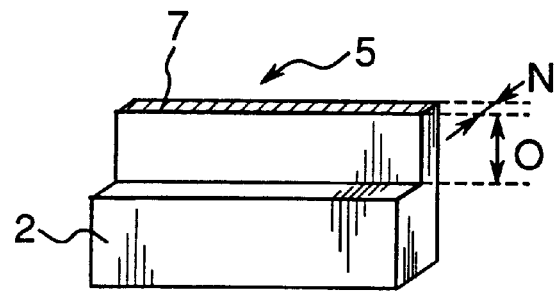

Observation by Transmission Electron Microscopy

Observation by Transmission Electron Microscopy

*Fig.6A* PRIOR ART  *Fig.6B* PRIOR ART
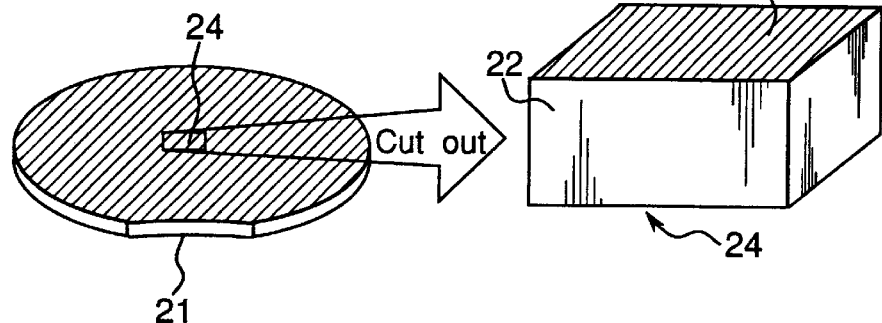
*Fig.7* PRIOR ART
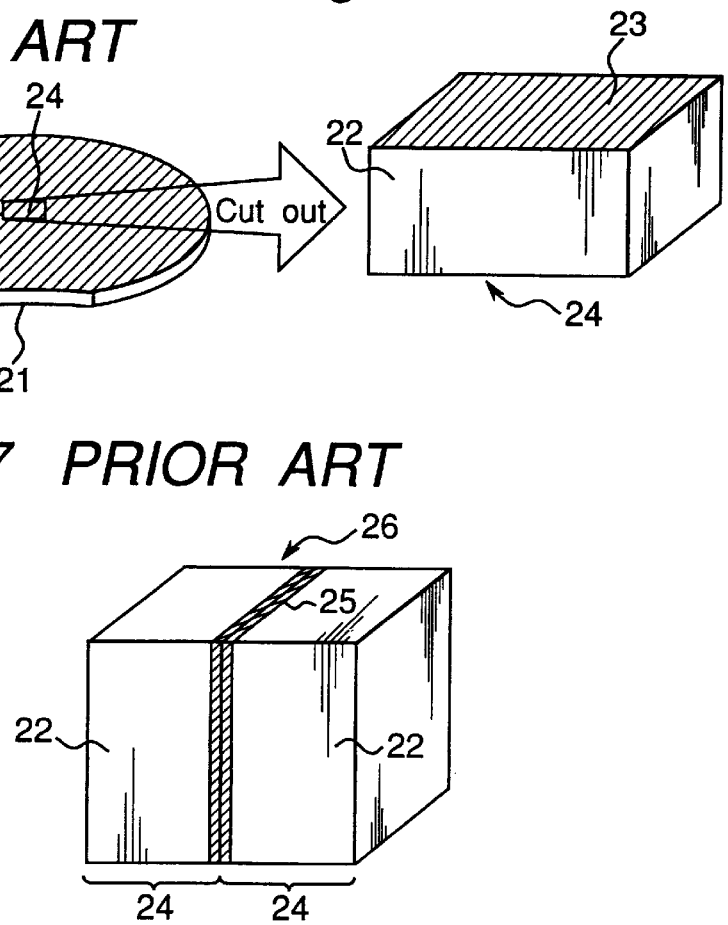
*Fig.8A* PRIOR ART  *Fig.8B* PRIOR ART
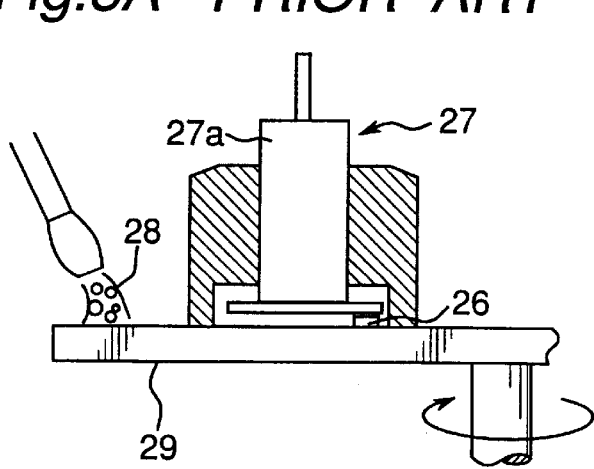
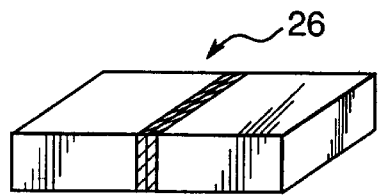

Observation by Transmission
Electron Microscopy

METHOD FOR OBSERVING A REACTION PROCESS BY TRANSMISSION ELECTRON MICROSCOPY

BACKGROUND OF THE INVENTION

The present invention relates to an improvement in a method for observing a reaction process by the transmission electron microscopy.

For observation of material structure by the transmission electron microscopy, a sample cut out of the material needs to be processed into a small thickness on the order of several tens to several hundred nm that enables the sample to transmit an electron beam.

A method of preparing transmission electron microscopic samples for observation under heating is presented, for example, in a literature "DENSHI KENBIKYO GIHO (Electron Microscopy), edited by Electron Microscopy Society of Japan, Kanto Branch, published by Asakura Shoten, 1991, pp. 119–130". In this method of preparing transmission electron microscopic samples, a sample piece cut out in a specified size is subjected to a mechanical grinding process so that its center becomes the thinnest. The sample piece is further subjected to a thinning process by ion milling or chemical etching. This processing is completed when the sample gets partly holed. The sample obtained in this way is observed by transmission electron microscopy in a wide area around the hole wherein the sample has a thickness of several tens to several hundred nm.

The above sample preparing method is described in detail with reference to FIGS. 6A, 6B, 7, 8A, 8B, 9A, 9B, 10A and 10B.

As shown in FIGS. 6A and 6B, a rectangular piece 24 of a 1 mm–3 mm square is cut out of a wafer 21. Reference numeral 22 denotes a substrate, and 23 denotes a surface of the piece prior to heat treatment. Two such pieces 24 are prepared. Then, as shown in FIG. 7, the two pieces 24, 24 are bonded together by thermosetting resin 25 with their surfaces 23 facing each other, and then baked for about 3 hours at 180° C. As a result, a sample 26 is produced.

Next, as shown in FIG. 8A, the sample 26 is attached to a bottom surface of a weight 27a of a grinding tool 27, with the bonded surfaces of the sample 26 being vertical to the weight bottom surface (see FIG. 8B). Then, the sample 26 is ground to a thickness of about 100 μm by rotating a rotary grinder 29 while an abrasive 28 is being fed. In this process, the sample 26 is abraded by successively changing the type of the abrasive 28 and of the rotary grinder 29 until a ground surface has no flaws. In this way, the surface of the sample 26 gradually changes from a coarse state to a fine state.

Next, as shown in FIG. 9A, the sample 26 is fixed on a sample mount 30 of a dimple grinder, facing down the surface 5 of the sample 26 ground by the rotary grinder 29. Then, a region 32 around the bonded part is ground into a mortar shape by a dimpler 31, as shown in FIG. 9B and FIG. 9C (a sectional view as indicated by arrows C—C of FIG. 9B).

Next, as shown in FIG. 10A, an ion beam 33 is applied to the opposite surfaces of the sample 26 by ion milling equipment. Thus, the sample 26 is ion milled to be thinned until a central portion of the area 32 has a thickness on the order of several tens to several hundred nm. The reason for using the ion milling technique to process the sample into a thickness on the order of several tens to several hundred nm is that there is a limit in thinning the sample through mechanical polishing by the rotary grinder 29, dimple grinder or the like.

The sample 26 thus obtained, shown in FIG. 10B, is fixed to a heatable holder of a transmission electron microscope. Then, changes in the state at the bonded part 34 are observed while heating is effected (with heating conditions changed).

Another method of preparing a sample for observation by the transmission electron microscopy different from the foregoing sample preparing method is described in Japanese Patent Laid-Open Publication HEI 5-180739. In this sample preparing method, a piece of specified dimensions is cut out of a material, and then the piece is subjected to a mechanical cutting process so as to be formed into an L-shape or a convex shape in cross section with its observation part left. After that, the observation part is further thinned by a convergent charged-particle beam, whereby a sample having a thickness of 0.1 μm is obtained.

The sample obtained in this way is fixed to a heatable holder of a transmission electron microscope. Then, changes in the state of the material piece around the observation surface is observed while heating is effected (with heating conditions changed).

However, when reaction process is observed with the sample prepared by either of the above conventional methods, there arises a problem as described below.

That is, for transmission electron microscopic observation of state changes of a material under heating, it is necessary to process the sample to a small thickness on the order of several tens to several hundred nm such that the sample can transmit an electron beam. Such a small thickness of the sample increases a ratio of cross sectional area to volume of a region where changes in state occur when heated, and also increases the area of contact with the vacuum. Thus, the heating of the sample having a film thickness small enough to transmit the electron beam would involve conditions different from the conditions in heating a sample in a wafer state as shown in FIG. 6A or a sample having a film thickness that is too large to transmit the electron beam.

Accordingly, with the experimental sample as prepared by either of the above conventional methods, a reaction process similar to that which actually occurs in a wafer state would not be able to be observed.

Thus, it could be conceived that after a thick-film sample is formed and heated, the sample is processed to such a thickness as to transmit the electron beam, and then observed by a transmission electron microscope. However, in this case, although observation of the state after the heating process is possible, observation of the state during the heating (i.e., an intermediate state) is impossible.

Of course, if a large number of wafers or thick-film samples that have been heated at various temperatures are prepared and processed into a thickness small enough to transmit the electron beam and then observed by a transmission electron microscope, intermediate states will be observed. Unfortunately, however, there arises a problem that numbers of samples would be needed. Further, there is another problem that because the heating temperature cannot be varied continuously, there may be cases in which changes in reaction process at certain temperatures cannot be observed.

SUMMARY OF THE INVENTION

Accordingly, an object of the present invention is to provide a method for observing a reaction process by transmission electron microscopy which is capable of carrying out a precise and correct observation involving a simultaneous heat treatment using only a few samples.

In order to achieve the aforementioned object, the present invention provides a method of observing a reaction process occurring during a heat treatment with a transmission electron microscope, comprising:

forming a first laminar portion in a sample by thinning a part of the sample to a thickness which allows transmission of an electron beam;

setting the sample formed with the first laminar portion in the transmission electron microscope and performing an observation at the first laminar portion while subjecting the sample to heat treatment;

taking the sample out of the transmission electron microscope after completion of the heat treatment, and forming a second laminar portion in the sample by thinning a part of the sample other than the first laminar portion to a thickness which allows transmission of an electron beam; and setting the sample formed with the two laminar portions in the transmission electron microscope and performing an observation at the two laminar portions without subjecting the sample to heat treatment.

With this method, as a result of the non-heated, transmission electron microscopic observation of the first laminar portion, which has been formed in the sample prior to the heat treatment and observed concurrently with the heating with a transmission electron microscope, and of the second laminar portion, which has been formed after the heat treatment, if the non-heated observation results of the two laminar portions are the same, the result of observing the first laminar portion while heating the sample is taken to represent a phenomenon that also occurs in a bulk state. On the other hand, if the non-heated observation results of the two laminar portions are different from each other, the phenomenon obtained by observing the first laminar portion while heating the sample is taken to represent a unique phenomenon resulting from the heating process that has been done in a laminar state. In this way, it is judged whether or not the result of the heated observation (i.e., observation done during the heat treatment) is correct. Thus, a precise observation involving the simultaneous heat treatment is carried out with a few samples.

In an embodiment, the thinning of the sample is achieved by applying a convergent charged-particle beam to the sample.

In this case, thickness and position of the laminar portions are easily controlled. Thus, only a desired portion of the sample is correctly thinned to a specified thickness small enough to transmit the electron beam.

In an embodiment, before forming the first laminar portion in the sample, a surface of the sample is coated with a material which is unreactive with a material of the surface of the sample during the heat treatment.

In this case, during the observation of the sample under heat treatment, reactions other than the aimed reaction in the sample can be prevented from occurrence by the coating material.

In an embodiment, the material of the surface of the sample is titanium (Ti) and the material coating the surface of the sample is titanium nitride (TiN), and a film of titanium and a film of titanium nitride are formed continuously in that order.

In this case, because the TiN film can be formed in the same process for forming the Ti film, a sample which avoids reactions other than the aimed reaction is easily formed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A and 1B are illustrations showing a process step of a procedure for preparing a sample to be used in the reaction process observation method by transmission electron microscopy according to the present invention;

FIG. 2 is an illustration showing a process step of the sample preparation procedure subsequent to the process step shown in FIGS. 1A and 1B;

FIG. 3 is an illustration showing a process step of the sample preparation procedure subsequent to the process step shown in FIG. 2;

FIGS. 6A and 6B are illustrations showing a process step of the procedure for preparing a sample to be used in the reaction process observation method by transmission electron microscopy according to the prior art;

FIG. 7 is an illustration showing a process step of the sample preparation procedure subsequent to the process step shown in FIGS. 6A and 6B;

FIGS. 8A and 8B are illustrations showing a process step of the sample preparation procedure subsequent to the process step shown in FIG. 7;

DETAILED DESCRIPTION OF THE PREFERRED EMBODIMENTS

Hereinbelow, the present invention is described in more detail by an embodiment thereof illustrated in the accompanying drawings.

Figure 4A:
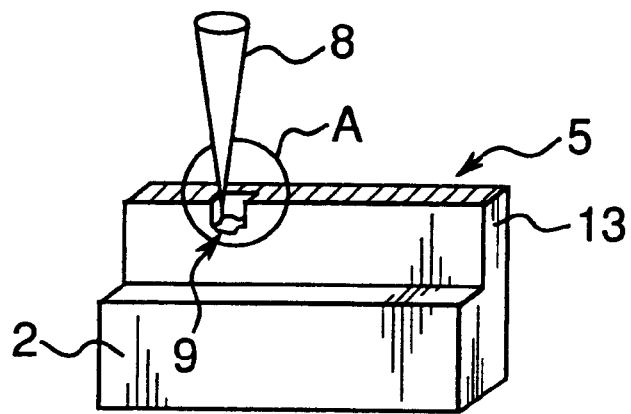
FIGS. 4A and 4B are illustrations showing a process step of the sample preparation procedure subsequent to the process step shown in FIG. 3.
Figure 4B:
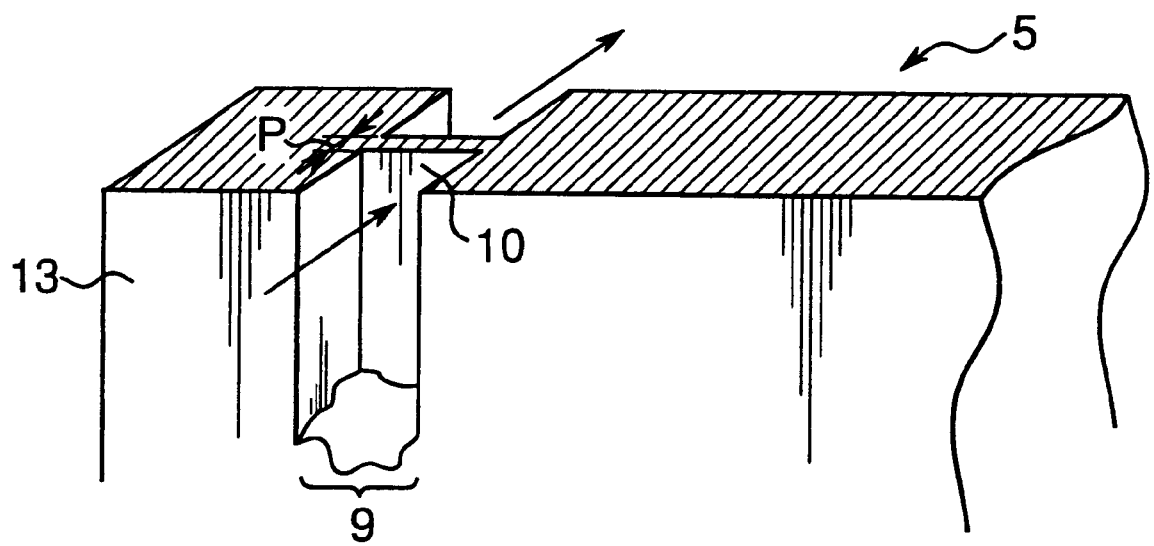
Figure 5A:
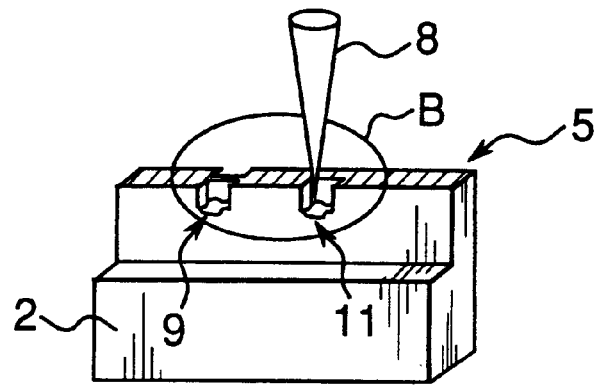
FIGS. 5A and 5B are illustrations showing a process step of the sample preparation procedure subsequent the process step shown in FIGS. 4A and 4B.
Figure 5B:
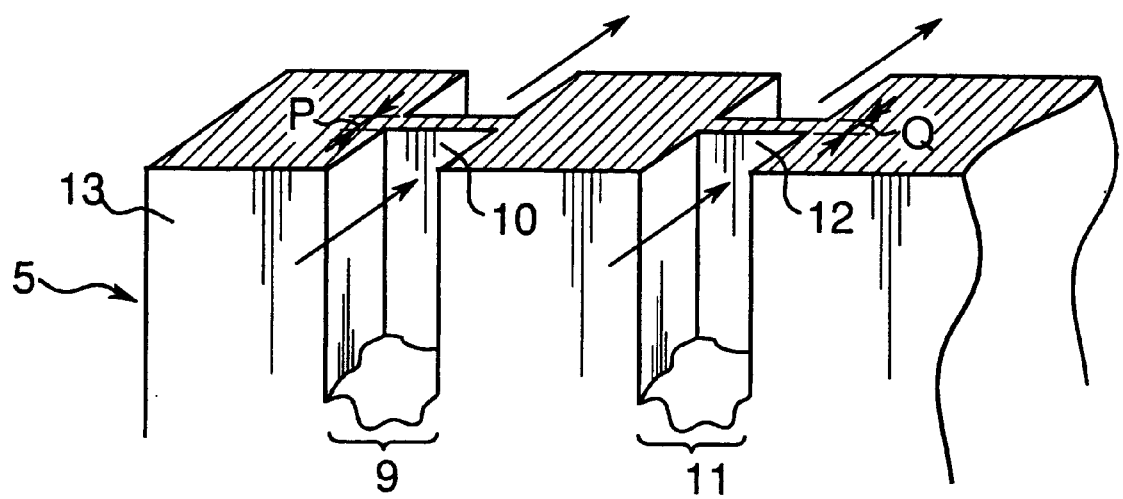
Figure 9A:
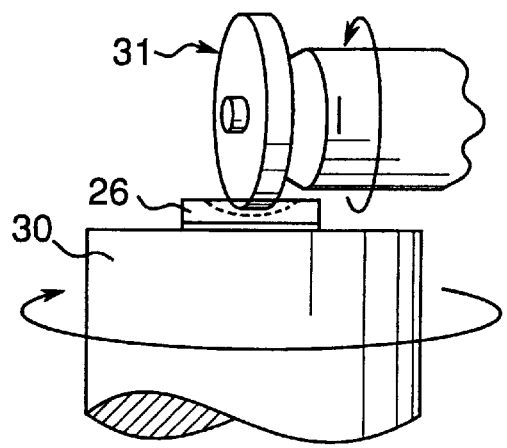
FIGS. 9A, 9B and 9C are illustrations showing a process step of the sample preparation procedure subsequent to the process step shown in FIGS. 8A and 8B.
Figure 9B:
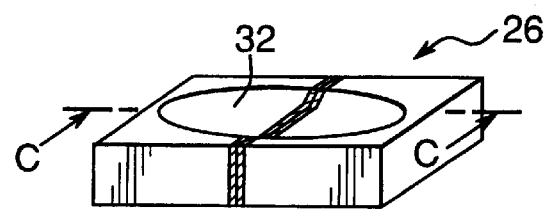
Figure 9C:
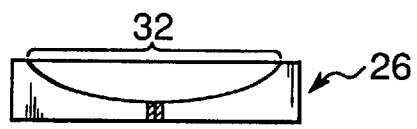
Figure 10A:
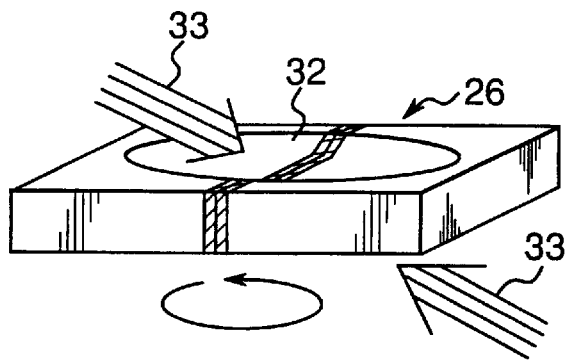
FIGS. 10A and 10B are illustrations showing a process step of the sample preparation procedure subsequent to the process step shown in FIGS. 9A, 9B and 9C.
Figure 10B:
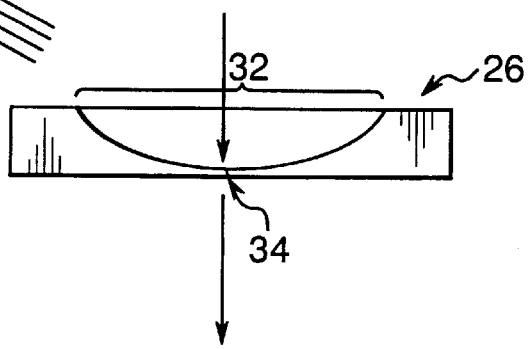

FIGS. 1A through 5B show the procedure for preparing a sample to be used in the transmission electron microscopic reaction process observation method according to this embodiment. With reference to those figures, the following describes a process of observing with a transmission electron microscope a silicification reaction between Ti(titanium) and a Si(silicon) substrate while it is heated. It is noted that FIG. 4B shows an enlarged view of part A in FIG. 4A, and FIG. 5B shows an enlarged view of part C in FIG. 5A.

First, as shown in FIG. 1A, a dice or piece of a size insertable in the transmission electron microscope is cut out of a wafer 1 prior to heat treatment by a dicing saw (not shown), whereby a sample 5 is obtained. The size of the sample 5 is typically L=30 $\mu$m–200 $\mu$m and M=1 mm–3 mm. As shown in FIG. 1B, the wafer 1 has been prepared by sputtering Ti 3 onto a Si substrate 2 and moreover continuously sputtering TiN (titanium nitride) 4 within the same chamber in order to prevent the Ti film 3 from oxidation or vaporization under vacuum or surface damage or the like. However, in FIGS. 2 to 5B, the Ti film 3 and the TiN film 4 are not shown.

Next, as shown in FIG. 2, a surface 7 (on the Ti film 3 side) of the sample 5 is cut to a depth of about 50 $\mu$m–200

μm by a dicing saw 6, with a portion of a narrow width of about 5 μm–50 μm left. In this way, the sample 5 is processed into an L-shape in cross section with a surface 7 side portion of width N (5 μm–50 μm)×height O (50 μm–200 μm) remaining like a post, as shown in FIG. 3.

Next, as shown in FIG. 4A, a Ga (gallium) ion beam 8 is applied by a convergent charged-particle beam equipment to the sample 5 along a side of a region 9 (which has a longitudinal length of 5 μm–50 μm) in a narrow width portion 13 left on the surface 7 side of the sample 5. Thus, the surface 7 side of the sample in the region 9 is formed into a lamina of a thickness 50 nm–200 nm which is small enough to allow the transmission electron microscopic observation to be effected.

The sample 5 having the thus formed laminar portion 10 is fixed to a heatable holder (not shown) within the transmission electron microscope. Then, an electron beam is applied to penetrate the laminar portion 10 while the sample 5 is heated within the transmission electron microscope. In this situation, the manner how the Ti film 3 reacts with the Si substrate 2 to form silicide is observed through the transmission electron microscope.

Upon completion of the transmission electron microscopic observation involving the simultaneous heating, the sample 5 is taken out of the holder. Then, as shown in FIG. 5A, the Ga ion beam 8 is applied along a region 11, other than the region 9, of a sufficient thickness in the sample 5 by the convergent charged-particle beam equipment, so that the surface 7 side region is formed into a lamina having a thickness of 50 nm to 200 nm which is small enough to allow an observation by transmission electron microscopy to be effected.

The sample 5 having the newly formed laminar portion 12 is then fixed to the holder for the transmission electron microscope. Then, electron beams are irradiated to penetrate the two laminar portions 10, 12 within the transmission electron microscope, and the two laminar portions 10 and 12 are observed in comparison with each other in a non-heated state. The silicide film has proved to be thicker in the laminar portion 10 than in the laminar portion 12, and to be stacked in multiple in the laminar portion 10. A comparison of the sample 5 with a sample silicified, or made into silicide, through heating in the wafer state shows that the laminar portion 12 exhibits the same state as the latter, suggesting that the heating process itself is no problematic and that the difference between the laminar portion 10 and the laminar portion 12 represents a phenomenon unique to the sample heated in a laminar or thin-film state. In this case, because the top of the Ti film 3 is covered with the TiN film 4, it can be said that the Ti film 3 suffers from no oxidation, vaporization, nor surface damage.

That is, in the transmission electron microscopic observation method for the reaction process according to this embodiment, it can be said that the laminar portion 12, which has been heated in its bulky state and afterwards formed into a lamina, represents a state of the sample heated in the form of wafer.

As described above, in this embodiment, the wafer 1 prior to being thermally treated is cut into a specified size to form the sample 5. Then, to obtain the laminar portion 10, the Ga ion beam 8 is applied to the region 9 on the surface 7 side of the sample 5, so that the sample 5 is formed into a lamina or thin film having a thickness of 50 nm–200 nm small enough to enable the transmission electron microscopic observation. While the obtained sample 5 is being heated within the transmission electron microscope, a reaction process in which silicification proceeds is observed. Thereafter, the Ga ion beam 8 is applied to a portion of a sufficient thickness of the sample 5 other than the laminar portion 10, whereby the other laminar portion 12 observable by transmission electron microscopy is formed. Then, the laminar portions 10 and 12 of the sample 5 are observed in comparison with each other in a non-heated state by the transmission electron microscopy.

According to this embodiment, after heating process, the laminar portion 12 which has been heated in a thick film state, and the laminar portion 10 which has been heated in a thin film state, are observed comparatively. And, if observation results of these laminar portions 10 and 12 are the same, it is inferred that the phenomenon observed in the laminar portion 10 during the heat treatment has occurred also in the bulk state. On the other hand, if observation results of the laminar portions 10 and 12 are different from each other, it is inferred that the phenomenon observed in the laminar portion 10 during the heat treatment is a unique phenomenon resulting from the heating of the sample in a thin film state, and that such a phenomenon does not occur in the bulk state.

Using the transmission electron microscopy for observing the reaction process as described above, it is easy to study heating conditions for the semiconductor manufacturing process even without actually operating production equipment. Accordingly, the time and labor required for process development can be reduced to a great extent.

The above has described on a case in which the present invention is applied to the observation of a reaction between a Ti film and a Si substrate into silicide. However, the present invention may be applied to the observation of various other phenomena such as reactions of Co(Cobalt)/Si, Ni(nickel)/Si or other Si compounds, reactions of Si crystals, movements of atoms in Al(aluminum) alloys or other metals, etc.

Further, in the above embodiment, although the Ga ion beam 8 is applied during the formation of the laminar portion 10 and the laminar portion 12, the kind of the convergent charged-particle beam to be applied is not limited to this.

Furthermore, the process of preparing a sample to be used for the reaction process observation by transmission electron microscopy according to the present invention is not limited to the one shown in FIGS. 1A, 1B through FIGS. 5A, 5B. In brief, the sample preparation method has only to be such that before and after the heat treatment, the same sample piece is thinned in different positions to a thickness on the order of several tens to several hundred nm which allows the thinned portions of the sample to transmit the electron beam.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of observing a reaction process occurring during a heat treatment with a transmission electron microscope, comprising:

forming a first laminar portion in a sample by thinning a part of the sample to a thickness which allows transmission of an electron beam;

setting the sample formed with said first laminar portion in the transmission electron microscope and performing an observation at said first laminar portion while subjecting the sample to heat treatment;

taking the sample out of the transmission electron microscope after completion of the heat treatment, and forming a second laminar portion in the sample by thinning a part of the sample other than said first laminar portion to a thickness which allows transmission of an electron beam; and setting the sample formed with the two laminar portions in the transmission electron microscope and performing an observation at the two laminar portions without subjecting the sample to heat treatment.

2. The method according to claim 1, wherein the thinning of the sample is achieved by applying a convergent charged-particle beam to the sample.

3. The method according to claim 1, further comprising:

before forming said first laminar portion in the sample, coating a surface of the sample with a material which is unreactive with a material of said surface of the sample during the heat treatment.

4. The method according to claim 3, wherein the material of said surface of the sample is titanium and the material coating said surface of the sample is titanium nitride; and a film of titanium and a film of titanium nitride are formed consecutively in that order.

* * * * *